(12) United States Patent
Nagasawa et al.

(10) Patent No.: US 6,258,449 B1
(45) Date of Patent: Jul. 10, 2001

(54) LOW-THERMAL EXPANSION CIRCUIT BOARD AND MULTILAYER CIRCUIT BOARD

(75) Inventors: Megumu Nagasawa; Masakazu Sugimoto; Yasushi Inoue; Kei Nakamura, all of Osaka (JP)

(73) Assignee: Nitto Denko Corporation, Tokyo (JP)

( * ) Notice: Subject to any disclaimer, the term of this patent is extended or adjusted under 35 U.S.C. 154(b) by 0 days.

(21) Appl. No.: 09/328,485

(22) Filed: Jun. 9, 1999

(30) Foreign Application Priority Data

Jun. 9, 1998 (JP) .................................................. 10-161108

(51) Int. Cl.$^7$ ........................................................ B32B 3/00
(52) U.S. Cl. .................. 428/209; 174/257; 174/258; 174/260; 257/702; 257/766; 428/901
(58) Field of Search ................................. 428/209, 901; 174/257, 258, 260; 257/702, 766

(56) References Cited

U.S. PATENT DOCUMENTS 4,769,270 * 9/1988 Nagamatsu et al. ................. 428/131
5,120,573 * 6/1992 Miyazaki et al. ..................... 427/96
5,153,986 * 10/1992 Brauer et al. ........................ 29/846
5,322,976 * 6/1994 Knudsen et al. ..................... 174/262
5,723,206 * 3/1998 Higashi et al. ...................... 428/215

FOREIGN PATENT DOCUMENTS

| 61-212096 | 9/1986 | (JP) . |
| 64-16836 | 1/1989 | (JP) . |
| 7-297560 | 11/1995 | (JP) . |
| 8-288649 | 11/1996 | (JP) . |

* cited by examiner

Primary Examiner—Cathy Lam
(74) Attorney, Agent, or Firm—Sughrue, Mion, Zinn, Macpeak & Seas, PLLC

(57) ABSTRACT

A low-thermal expansion circuit board comprising an insulating layer made of an organic polymer having thereon a wiring conductor for bare chip mounting, wherein the wiring conductor is an iron-nickel-based alloy layer having a copper layer on at least one side thereof; and a low-thermal expansion multilayer circuit board having a plurality of the low-thermal expansion circuit boards via an adhesive layer, the adhesive layer having through-holes filled with solder to connect the circuits layers.

3 Claims, 5 Drawing Sheets

LOW-THERMAL EXPANSION CIRCUIT BOARD AND MULTILAYER CIRCUIT BOARD

FIELD OF THE INVENTION

This invention relates to a low-thermal expansion circuit board and a low-thermal expansion multilayer circuit board for bare chip mounting which have a small thermal expansion coefficient and are therefore highly reliable.

BACKGROUND OF THE INVENTION

With the recent tendencies for electronic equipment to have a smaller size and higher performance, it has been demanded for semiconductor devices constituting electronic equipment and printed circuit boards for mounting the devices to have reduced size and thickness, higher performance and higher reliability. To meet these demands, pin insertion mount is being displaced by surface mount, and, in recent years, a surface mount technology called bare chip mount has been under study, in which non-packaged (bare) semiconductor elements are directly mounted on a printed circuit board.

In bare chip mounting, however, because silicon chips having a thermal expansion coefficient of 3 to 4 ppm/° C. are directly mounted on a printed circuit board having a thermal expansion coefficient of 10 to 20 ppm/° C., stress is developed due to the difference in thermal expansion to impair the reliability. The stress causes joint fracture in, for example, flip chip bonding, which will lead to a faulty electrical connection.

In order to relax the thermal stress, it has been practiced to fill the gap between a mounted semiconductor element and a printed circuit board with an adhesive called an underfilling material thereby to disperse the stress imposed to the joint. In order for the stress to be absorbed by the printed circuit board itself, a multilayer printed circuit board having shear stress-absorbing layers between circuit layers to provide a stepwise gradation of thermal expansion coefficient in its thickness direction has been proposed (see JP-A-7-297560). However, reliability achieved by these techniques is still insufficient. It is indispensable for securing further improved reliability to diminish the thermal expansion coefficient of the printed circuit board itself.

In this connection, JP-A-61-212096 teaches a multilayer circuit board comprising an Fe—Ni alloy substrate having alternately formed thereon insulating layers and wiring conductors and, if desired, having solder pads formed on the top layer thereof by photoetching, the substrate, the insulating layers and the wiring conductors being united into an integral laminate by pressure bonding under heat. The technique disclosed has the following disadvantages. Where copper is used as a wiring conductor, it is difficult to reduce the thermal expansion coefficient of the whole circuit board to the level of silicon because the elastic modulus of copper is far greater than that of a polyimide resin used as an insulating layer. The wiring conductor is formed by thin metallic film formation techniques, such as vacuum deposition and sputtering, which have low productivity and incurs increased cost. Formation of solder pads by deposition followed by photoetching requires complicated steps.

On the other hand, the increasing I/O pin count of semiconductors to be mounted has increased the necessity of laminating a plurality of circuit boards. A multilayer circuit board can be produced by a build up method comprising alternately building up, on one or both sides of a substrate, insulating layers of a photosensitive resin and conductor layers formed by plating or deposition. The build up method is disadvantageous in that the production process is complicated and involves many steps, the yield is low, and much time is required.

JP-A-8-288649 proposes a method for producing a multilayer circuit board comprising forming protrusions of conductive paste by means of a dispenser, etc. on the copper side of a single-sided copper-clad epoxy/glass laminate, pressing an adhesive sheet and copper foil thereto, and repeating these steps. This technique is unsatisfactory in reliability of electrical connection, connection resistivity, and the like, and is hardly applicable to fine circuits. Further, it is a time-consuming method that the step of pressing must be repeated as many times as the number of the layers.

The inventors of the present invention have found that the above-described problems associated with conventional techniques are chiefly caused by the extremely greater thermal expansion of the board, more specifically, the organic materials making up the insulating layer, such as an epoxy resin and a polyimide resin, and copper as a wiring material, than that of semiconductor elements. Copper, which is commonly used as a wiring conductor, has not only a large thermal expansion coefficient but a large modulus of elasticity to increase the stress of thermal expansion. Notwithstanding, copper is an excellent electrically conductive material and has come to be indispensable as a wiring material.

SUMMARY OF THE INVENTION

An object of the present invention is to provide a low-thermal expansion circuit board and a low-thermal expansion multilayer circuit board which have a small thermal expansion coefficient and are excellent in reliability.

The above object is accomplished by a low-thermal expansion circuit board comprising an insulating layer made of an organic polymer having thereon a wiring conductor for bare chip mounting, wherein the wiring conductor comprises an iron-nickel-based alloy layer having a copper layer on at least one side thereof.

The object is also accomplished by a multilayer circuit board having a plurality of the above-described low-thermal expansion circuit boards laminated integrally.

In the practice of the present invention, the multilayer circuit board has a plurality of double-sided circuit boards integrally laminated with an adhesive layer interposed between every adjacent circuit boards, the adhesive layer having through-holes at positions connecting the wiring conductors of the adjacent upper and lower double-sided circuit boards, and the through-holes containing a conductor made of solder by which the wiring conductors of the adjacent double-sided circuit boards are electrically connected.

As a result of extensive study, the inventors have developed a highly reliable low-thermal expansion circuit board by using a composite wiring material composed of an iron-nickel-based alloy layer having a low thermal expansion coefficient and a copper layer provided on at least one side of the alloy layer. Copper wiring, which is the chief cause of the great thermal expansion of the circuit board, being directly formed on an iron-nickel-based alloy layer having a low thermal expansion coefficient, the stress on thermal expansion of the wiring conductor can be reduced. As a result, thermal expansion of the circuit board as a whole can be suppressed thereby to bring about improved reliability of bonding after bare chip mounting.

The thermal expansion coefficient of the insulating layer, which is another cause of the great thermal expansion of the circuit board, can be reduced by using a polyimide resin prepared from pyromellitic acid dianhydride (hereinafter abbreviated as PMDA), m-tolidine (hereinafter abbreviated as m-TLD), and diaminodiphenyl ether (hereinafter abbreviated as DDE) which has a small thermal expansion coefficient. The reliability of the circuit board can thus be enhanced further.

Where the insulating layer made of an organic polymer contains a core made of an iron-nickel-based alloy or a ceramic material, the thermal expansion coefficient of the insulating layer can further be reduced.

Laminating the low-thermal expansion circuit boards of the present invention provides a multilayer circuit board having the above-mentioned advantages.

DETAILED DESCRIPTION OF THE INVENTION

The low-thermal expansion circuit board intended in the present invention means a circuit board having a thermal expansion coefficient lower than the thermal expansion coefficient of 10 to 20 ppm/° C.

The iron-nickel-based alloy which can be used in the invention includes not only an iron-nickel binary alloy but iron-nickel alloys containing other elements such as cobalt as far as a low thermal expansion coefficient is maintained. A preferred Ni content in the Fe—Ni binary alloy ranges from 31 to 50% by weight. Out of this range, the alloy has an increased thermal expansion coefficient, tending to have reduced reliability of bonding. The Fe—Ni—Co alloy includes those having an Ni/Co/Fe weight ratio of 29/16/55, 32/8/60 and 36/4/60, which are commercially available from Sumitomo Special Metals Co., Ltd. under trade names of KV-2, KV-25 and Superinvar, respectively.

It is desirable that the total thickness of iron-nickel-based alloy layer(s) be 10% or more in the total thickness of the circuit board and be greater than the total thickness of the copper layer(s). With thinner iron-nickel-based alloy layers, the circuit board will have an increased thermal expansion coefficient and reduced reliability. The thickness of the circuit board is preferably 200 μm or smaller per wiring conductor for achieving high-density mounting.

The organic polymer which can be used as an insulating layer is selected appropriately from among those well-known in the art, such as phenolic resins, epoxy resins, polyester resins, polysulfone resins, polyether-imide resins, polyether ketone resins, and polyimide resins. If desired, the organic polymer material can be used in combination with paper, glass cloth, glass mat, glass nonwoven fabric, Kevlar fiber, and the like to form a composite insulating layer.

An insulating layer made of a polyimide resin prepared from PMDA, m-TLD, and DDE is preferred for its small thermal expansion coefficient. While polyimide having a small thermal expansion coefficient can be obtained with the molar ratio of m-TLD and DDE to PMDA ranging from 0 to 100 mol %, the thermal expansion coefficient decreases with an increase of the proportion of m-TLD. In particular, when the proportion of m-TLD is 50 to 100 mol %, the polyimide resin has a thermal expansion coefficient of 10 ppm/° C. or less, and this is suitable to realize a circuit board having a thermal expansion coefficient of 10 to 20 ppm/° C. or less.

The ceramic material which can be used as a core of the insulating layer is selected appropriately from those having a low thermal expansion coefficient, such as alumina, mullite, cordierite, silicon carbide, silicon nitride, aluminum nitride, and zirconia.

Processes for producing the low-thermal expansion (multilayer) circuit board according to the present invention will be illustrated by referring to the accompanying drawings.

Figure 1:
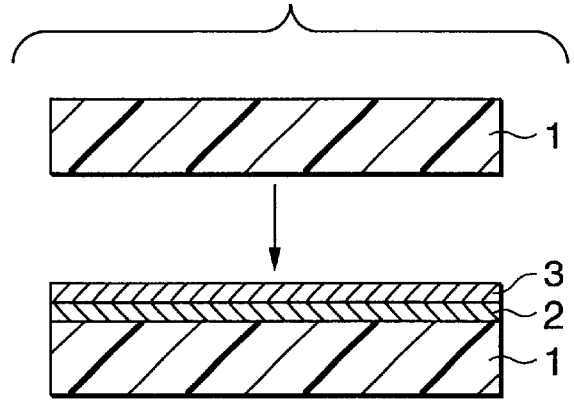
FIGS. 1 through 6 each provide a cross sectional view showing preparation of the low-thermal expansion circuit board according to the present invention.
Figure 2:
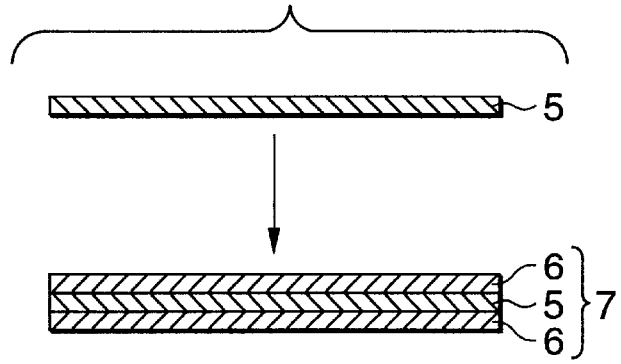
Figure 3:
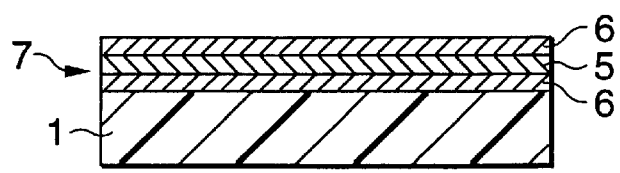
Figure 4:
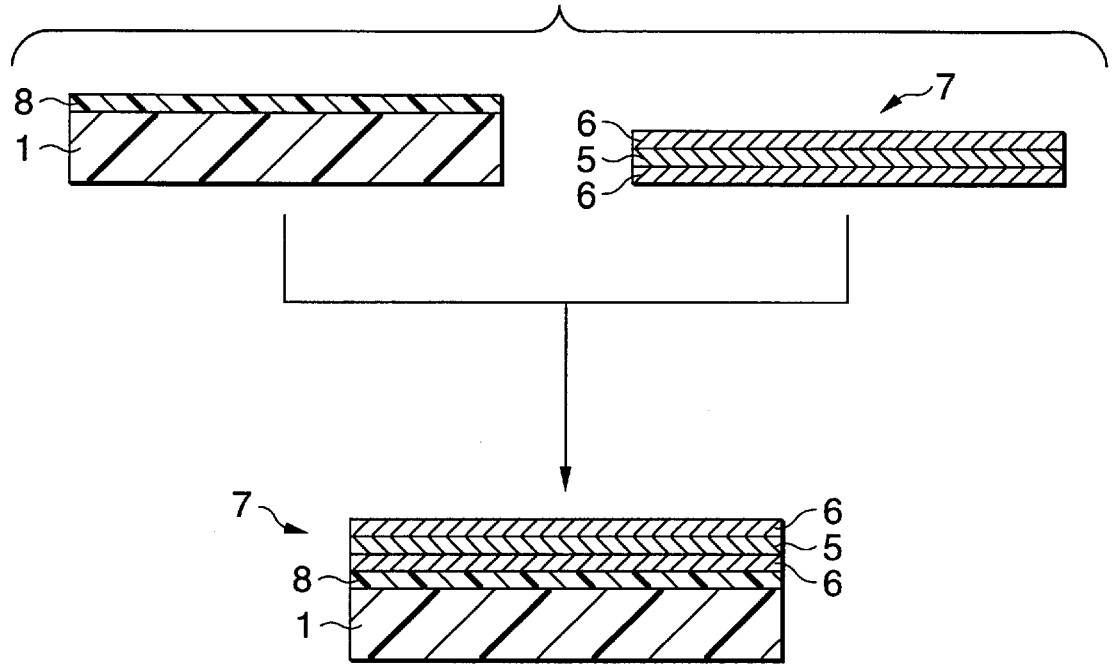
Figure 5:
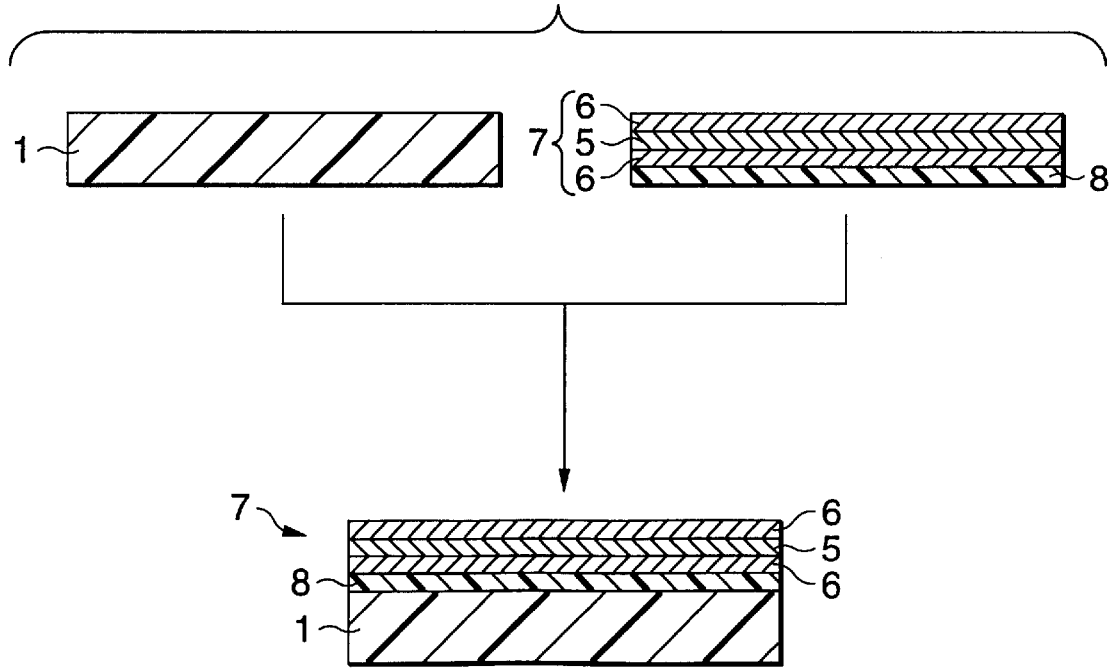
Figure 6:
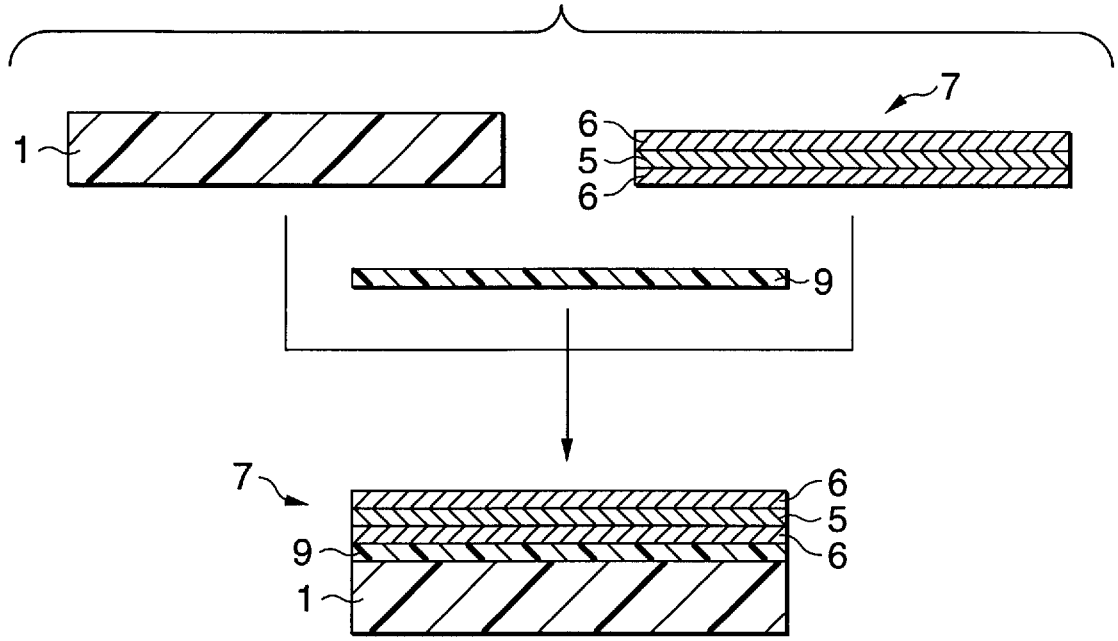

A circuit board precursor having a copper layer on one side thereof, i.e., a single-sided copper-clad laminate is prepared as follows. A first process shown in FIG. 1 comprises metallizing an organic polymer layer (insulating layer) 1 by an appropriate combination of deposition, electroless plating, electroplating, etc. to form an iron-nickel-based alloy layer 2 and a copper layer 3. A second process shown in FIGS. 2 and 3 comprises forming a copper layer 6 on both sides of an iron-nickel-based alloy foil 5 by deposition, plating, cladding, etc. to previously form a multilayer metal foil 7 as a wiring conductor and forming an organic polymer layer 1 on the surface of the multilayer metal foil 7 by, for example, casting. A third process shown in FIG. 4 comprises forming an adhesive layer 8 on an organic polymer layer 1 by, for example, casting and heat and pressure bonding the multilayer metal foil 7 shown in FIG. 2 onto the adhesive layer 8. A fourth process shown in FIG. 5 comprises providing the multilayer metal foil 7 shown in FIG. 2 with an adhesive layer 8 by, for example, casting and heat and pressure bonding an organic polymer layer 1 onto the adhesive layer 8. A fifth process shown in FIG. 6 comprises preparing an organic polymer layer 1, a multilayer metal foil 7 shown in FIG. 2, and an adhesive sheet 9 and heat and pressure bonding the organic polymer layer 1 and the multilayer metal foil 7 via the adhesive sheet 9.

The adhesive used in the third to fifth processes as an adhesive layer 8 or an adhesive sheet 9 includes thermosetting resins and thermoplastic resins, such as epoxy resins, phenolic resins, polyimide resins, and polyamide resins.

A circuit board precursor having a copper layer on both sides thereof, i.e., a double-sided copper-clad laminate can be prepared in accordance with the above-mentioned processes for preparing a single-sided copper-clad laminate. That is, a pair of single-sided copper-clad laminates are joined to each other with a cast adhesive layer or an adhesive sheet therebetween. A double-sided copper-clad laminate can also be prepared by laminating the multilayer metal foil 7 shown in FIG. 2 on the organic polymer layer side of a single-sided copper-clad laminate via an adhesive layer or an adhesive sheet. Where a double-sided copper-clad laminate is prepared by using single-sided copper-clad laminates obtained by the third to fifth processes, it is possible to conduct the two steps of heat and pressure bonding simultaneously. As a modification of the first process, the organic polymer layer 1 can be metallized on both sides thereof to prepare a double-sided copper-clad laminate.

A copper-clad laminate having a core in its insulating layer can be prepared in the same manner as described above, except for replacing the organic polymer layer 1 with a composite insulating layer prepared by heat and pressure bonding an organic polymer layer onto each side of a core via a cast adhesive layer or an adhesive sheet. The pressure bonding steps involved can be effected simultaneously. A copper-clad laminate having a core in its insulating layer can be prepared by any other combination of heat and pressure bonding, casting, and metallizing.

A circuit pattern is formed on the single-sided or double-sided copper-clad laminate by a conventional subtractive process. Through-holes can be made through the double-sided copper-clad laminate. Where through-holes are made through a double-sided copper-clad laminate having an electrically conductive material (e.g., metal) as a core, electrical connections between the through-holes and the metallic core must be avoided. That is, through-holes are previously made through a metallic core and, after a wiring conductor is provided on both sides of the composite insulating layer having the metallic core, through-holes smaller than those of the metallic core are made through the copper-clad laminate concentrically with the through-holes of the metallic core. Further, after formation of the through-holes, both surfaces of the circuit board and the inner wall of the through-holes may be plated with copper.

The process for producing the multilayer circuit board of the invention will now be explained. As stated above, it is difficult with known multilayer circuit board structures and known processes for producing them to satisfy all the demands for simplicity and economy of process, reliability on connections among circuit layers, and a reduced pitch. This is the very point the present invention aims at. In the present invention simplification of the laminating step and improvement of economy are achieved by bonding a plurality of double-sided circuit boards under heat and pressure all at once unlike the conventional build up method. Electrical connections among circuit layers are achieved by a conductor made of solder to secure higher reliability than conventional connections by conductive paste. The laminating can be carried out by temporarily sticking an adhesive sheet having through-holes to a double-sided circuit board at a right position, forming solder bumps in the through-holes of the adhesive sheet, temporarily adhering another double-sided circuit board to the adhesive sheet at a right position, and finally bonding the laminate under heat and pressure into an integral body.

The adhesive sheet suitably used in the preparation of the multilayer circuit board includes a sheet of thermosetting or thermoplastic resins, such as epoxy resins, phenolic resins, polyimide resins, and polyamide resins. Polyimide resins are preferred for their reliability. Where the adhesive sheet contains a thermosetting component, it should be temporarily adhered to the double-sided circuit board under controlled conditions so that curing may not proceed to such an extent to lose re-adhesiveness in subsequent pressure bonding into a multilayer circuit board. The thickness of the adhesive sheet is preferably 10 $\mu$m or greater for securing workability and for leveling the unevenness of the circuit and is preferably 200 $\mu$m or smaller for reducing the total thickness of the multilayer circuit board. Through-holes can be made by known techniques, such as drilling and punching.

Solder bumps can be formed by electroplating or printing with soldering paste. Printing with soldering paste is preferred for its simplicity. The size of solder ball in the paste is 100 $\mu$m or smaller, preferably 50 $\mu$m or smaller, still preferably 20 $\mu$m or smaller. The solder composition is designed to have an appropriate melting point in accordance with the kind of the insulating layer and the necessity in mounting. The pressure bonding temperature may be either higher or lower than the melting point of the solder as far as the adhesive sheet can manifest sufficient adhesiveness (500 g/cm or more). At temperatures higher than the melting point of the solder, there is formed a metallic joint. Even at temperatures lower than the melting point of the solder, satisfactory electrical connections between circuit layers are secured.

Figure 7:
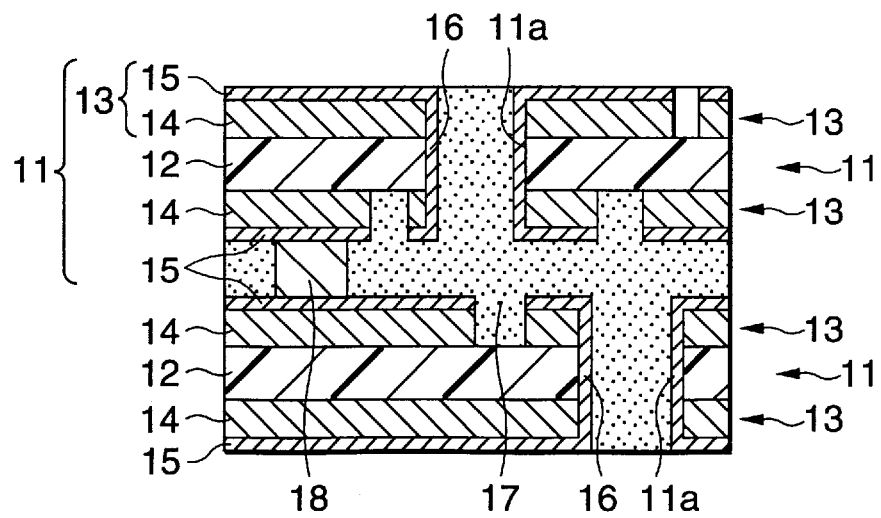
FIG. 7 is a cross sectional view of an example of the low-thermal expansion multilayer circuit board according to the present invention.

FIG. 7 shows an embodiment of the multilayer circuit board of the invention. Numeral 11 is a double-sided circuit board composed of an insulating layer 12 made of a polyimide resin having formed on both sides thereof a double metal foil (wiring conductor) 13, the double metal foil 13 being composed of an iron-nickel-based alloy foil 14 and a copper foil 15 as an outer layer. In this particular embodiment two double-sided circuit boards are laminated to provide a multilayer circuit board having 4 circuit layers. Each double-sided circuit board 11 has a through-hole 11a plated with copper to provide a plated through-hole 16 by which the double metal foils 13 on both sides are electrically connected. The two double-sided circuit boards 11 are joined via a polyimide adhesive layer 17 and electrically connected to each other by a conductor 18 made of solder.

Figure 8:
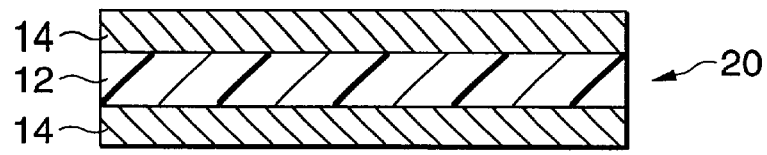
FIG. 8 is a cross sectional view of a three-layer sheet.
Figure 11:
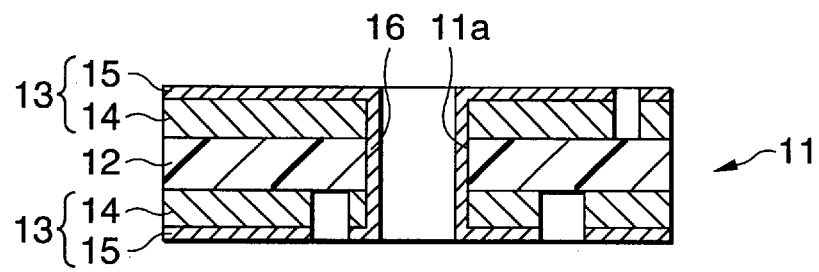
FIG. 11 is a cross sectional view of the three-layer sheet of FIG. 10, with a circuit pattern formed on both sides thereof, i.e., a both-sided circuit board.
Figure 12:
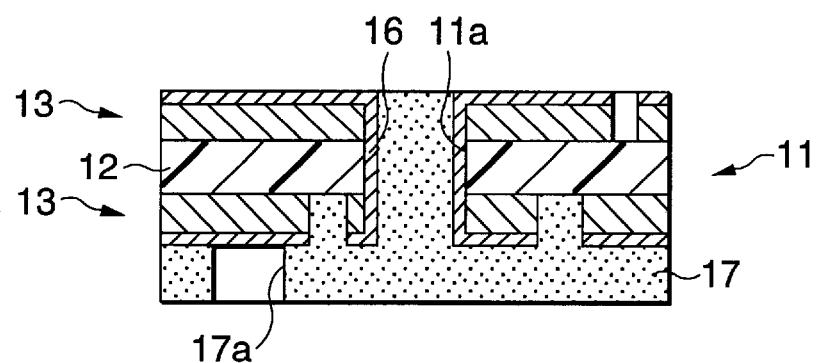
FIG. 12 is a cross sectional view of the double-sided circuit board of FIG. 11 having an adhesive sheet temporarily adhered thereto.
Figure 13:
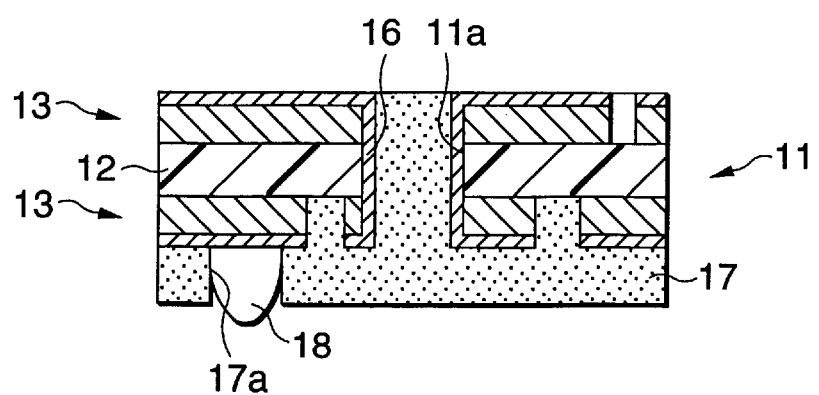
FIG. 13 is a cross sectional view of the double-sided circuit board of FIG. 12 with a solder bump formed in the through-hole of the adhesive sheet.

The multilayer circuit board of FIG. 7 is produced as follows. A polyimide precursor varnish is applied to an iron-nickel-based alloy foil 14, dried, and converted to a polyimide layer 12 to prepare a two-layer sheet. Two two-layer sheets are pressure bonded under heat via an adhesive sheet with the polyimide layers 12 facing each other to obtain a three-layer sheet 20 shown in FIG. 8. A through-hole 11a is drilled in the three-layer sheet 20 at a predetermined position, and the through-hole 11a and the alloy foil 14 on both sides are plated with copper by electroless plating and electroplating to obtain a double-sided copper-clad laminate 21 shown in FIG. 10, in which numeral 15 indicates a copper foil formed by copper plating. A circuit pattern is made on the double metal foil 13 (composed of the alloy foil 14 and the copper foil 15) on each side to prepare a double-sided circuit board 11 shown in FIG. 11. An adhesive sheet 17 previously having a through-hole 17a made at a predetermined position is pressure bonded under heat to one side of the double-sided circuit board 11 with the through-hole 17a being positioned accurately as shown in FIG. 12. The adhesive sheet 17 in FIG. 12 corresponds to the adhesive layer 17 in FIG. 7. The through-hole 17a is filled with soldering paste by screen printing through a metal mask to form a solder bump 18 as shown in FIG. 13. A separately prepared double-sided circuit board 11 having a through-hole at a predetermined position is then heat and pressure bonded to another double-sided circuit board 11 having the solder bump 18 while positioning, thereby to obtain an integral 4-layer circuit board shown in FIG. 7, in which the two double-sided circuit boards 11 are electrically connected via the solder bump 18.

According to the above-described embodiment, the wiring conductor, i.e., the double metal foil 13 made up of the iron-nickle-based alloy foil 14 and the copper foil 15, has a small thermal expansion coefficient so that the multilayer circuit board has excellent reliability. Moreover, the production process is simple and economical.

The present invention will now be illustrated in greater detail with reference to Examples, but it should be understood that the invention is not deemed to be limited thereto.

EXAMPLE 1

A polyimide precursor varnish (a polyamic acid varnish prepared by reacting p-phenylenediamine and 3,3',4,4'-biphenyltetracarboxylic acid dianhydride in N-methylpyrrolidone) was applied to a 10 μm-thick metal foil made of a nickel-iron (42/58% by weight) alloy (thermal expansion coefficient: 5 ppm/° C.), dried, and treated at 400° C. for 1 hour in a nitrogen atmosphere to form a polyimide 10 μm thick. The resulting two-layer sheet was bonded to another two-layer sheet prepared similarly with the polyimide layers facing each other via a 35 μm-thick polyimide adhesive sheet (SPB-035A, produced by Nippon Steel Chemical Co., Ltd.) at 200° C. while applying a pressure of 40 kg/cm$^2$ for 1 hour to prepare a three-layer sheet. Copper was then deposited on the alloy foil on each side of the three-layer sheet by electroless plating and electroplating to a deposit thickness of 9 μm to prepare a double-sided copper-clad laminate.

EXAMPLE 2

A double-sided copper-clad laminate was prepared in the same manner as in Example 1, except for changing the alloy composition of the metal foil to nickel/iron=36/64% by weight (thermal expansion coefficient: 1.5 ppm/° C.).

EXAMPLE 3

A double-sided copper-clad laminate was prepared in the same manner as in Example 1, except for changing the alloy composition of the metal foil to nickel/cobalt/iron=32/8/60% by weight (thermal expansion coefficient: 1.0 ppm/° C.).

EXAMPLE 4

A double-sided copper-clad laminate was prepared in the same manner as in Example 1, except that a polyimide adhesive sheet comprising PMDA, m-TLD and DDE at a molar ratio of 50/40/10 was used.

EXAMPLE 5

A double-sided copper-clad laminate was prepared in the same manner as in Example 1, except that the polyimide adhesive sheet was replaced with a 30 μm-thick nickel/iron (42/58% by weight) alloy layer having on both sides thereof a 35 μm-thick polyimide adhesive sheet (SPB-035A).

EXAMPLE 6

A double-sided copper-clad laminate was prepared in the same manner as in Example 2, except that the polyimide adhesive sheet was replaced with a 50 μm-thick nickel/iron (36/64% by weight) alloy layer having on both sides thereof a 35 μm-thick polyimide adhesive sheet (SPB-035A).

EXAMPLE 7

A double-sided copper-clad laminate was prepared in the same manner as in Example 1, except that the polyimide adhesive sheet was replaced with a 200 μm-thick aluminum nitride sheet (thermal expansion coefficient: 4.3 ppm/° C.) having on both sides thereof a 35 μm-thick polyimide adhesive sheet (SPB-035A).

EXAMPLE 8

Figure 9:
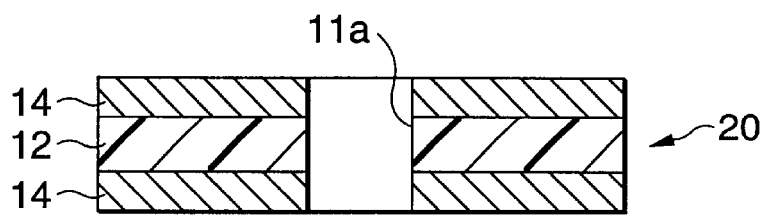
FIG. 9 is a cross sectional view of the three-layer sheet of FIG. 8 with a through-hole made therein.
Figure 10:
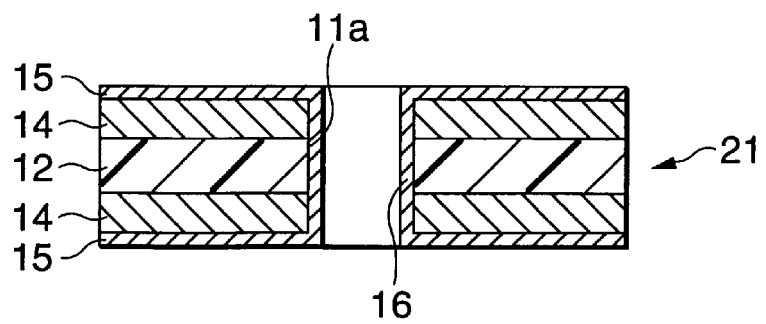
FIG. 10 is a cross sectional view of the three-layer sheet of FIG. 9, with the through-hole being plated with copper.

A double-sided copper-clad laminate having through-holes shown in FIG. 10 was prepared in the same manner as in Example 1, except that through-holes having a diameter of 0.2 mm were drilled through the three-layer sheet (before copper plating) at predetermined positions (see FIG. 9). A circuit pattern was formed on the copper foil on each side to prepare a double-sided circuit board shown in FIG. 11. A polyimide adhesive sheet (SPB-035A) having through-holes of 0.2 mm in diameter previously made at predetermined positions was pressed onto one side of the double-sided circuit board at 180° C. under 30 kg/cm$^2$ for 30 minutes while positioning accurately as shown in FIG. 12. Soldering paste (Sn8RA-3AMQ, produced by Nippon Sperior K.K.; melting point: 260° C.) was screen printed on the adhesive sheet through a metal mask to fill the through-holes with the soldering paste. After reflow at 290° C., the flux was washed away to form solder bumps as shown in FIG. 13. The resulting board with solder bumps was pressure bonded with another separately prepared double-sided circuit board having through-holes while positioning at 200° C. and 30 kg/cm$^2$ for 1 hour to obtain a 4-layered circuit board in which two double-sided circuit boards were electrically connected via the solder bumps.

Comparative Example 1

A polyimide precursor varnish (a polyamic acid varnish prepared by reacting p-phenylenediamine and 3,3',4,4'-biphenyltetracarboxylic acid dianhydride in N-methylpyrrolidone) was applied to 18 μm-thick rolled copper foil, dried, and treated at 400° C. for 1 hour in a nitrogen atmosphere to form a polyimide layer having a thickness of 10 μm. The resulting two-layer sheet was adhered to another two-layer sheet prepared similarly with the polyimide layers facing each other via a 35 μm-thick polyimide adhesive sheet (SPB-035A) at 200° C. under pressure of 40 kg/cm$^2$ for 1 hour to prepare a double-sided copper-clad laminate.

Comparative Example 2

A 4-layered circuit board was prepared in the same manner as in Example 8, except that epoxy-silver paste was screen printed in place of the soldering paste and heat-cured to form bumps.

The thermal expansion coefficient of the double-sided copper-clad laminates prepared in Examples 1 to 7 and Comparative Example 1 was measured in a temperature range of from room temperature (25° C.) up to 200° C. The results obtained are shown in Table 1 below.

TABLE 1

|  | Thermal Expansion Coefficient (ppm/° C.) |
| --- | --- |
| Example 1 | 7.0 |
| Example 2 | 4.2 |
| Example 3 | 3.5 |
| Example 4 | 5.8 |
| Example 5 | 5.5 |
| Example 6 | 3.0 |
| Example 7 | 5.0 |
| Comparative Example 1 | 17.0 |

As is apparent from Table 1, the circuit boards according to the present invention have an extremely small thermal expansion coefficient, proving suitable to bare chip mounting.

The multilayer circuit boards obtained in Example 8 and Comparative Example 1 were subjected to a thermal cycle test to evaluate the reliability of the bump connection. As a result, 100% of the bump joints in both samples showed satisfactory electrical conduction immediately after heat and pressure bonding. After 500 thermal cycles of from 125° C.×30 minutes to −50° C.×30 minutes were given, 100% of the bump joints in Example 8 achieved electrical conduction, whereas 10% of the bump joints in Comparative Example 2 showed faulty electrical connection. The multilayer circuit board of the invention has now been proved superior in reliability.

While in Example 8 filling of the through-holes 17a of the adhesive sheet 17 with soldering paste was carried out by screen printing, it may be effected by dispenser application or transfer application.

While the invention has been described in detail and with reference to specific examples thereof, it will be apparent to one skilled in the art that various changes and modifications can be made therein without departing from the spirit and scope thereof.

What is claimed is:

1. A low-thermal expansion circuit board comprising an insulating layer comprising an organic polymer having thereon a wiring conductor for bare chip mounting, wherein said wiring conductor is an iron-nickel-based alloy layer having two opposing major surfaces, and a copper layer on at least one of said major surfaces.

2. The low-thermal expansion circuit board according to claim 1, wherein said insulating layer is made of a polyimide resin prepared from pyromellitic acid dianhydride, m-tolidine, and diaminodiphenyl ether.

3. The low-thermal expansion circuit board according to claim 1, wherein said insulating layer has a core made of an iron-nickel-based alloy or a ceramic material.

* * * * *